United States Patent [19]

Feemster

[11] Patent Number: 5,086,236

[45] Date of Patent: Feb. 4, 1992

[54] SYNCHRONIZING CIRCUIT OF TWO CLOCK SIGNALS

[75] Inventor: Ryan E. Feemster, Austin, Tex.

[73] Assignee: Advanced Micro Devices, Inc., Sunnyvale, Calif.

[21] Appl. No.: 572,716

[22] Filed: Aug. 27, 1990

[51] Int. Cl.[5] .................. H03K 5/13; H03K 19/096
[52] U.S. Cl. ......................... 307/269; 307/481
[58] Field of Search .................. 307/269, 480, 481

[56] References Cited

U.S. PATENT DOCUMENTS

| 4,417,158 | 11/1983 | Ito et al. | 307/269 |
| 4,691,122 | 9/1987 | Schnizlein et al. | 307/481 |
| 4,691,124 | 9/1987 | Ledzius et al. | 307/269 |
| 4,758,737 | 7/1988 | Hirano | 307/480 |
| 4,973,860 | 11/1990 | Ludwig | 307/269 |

*Primary Examiner*—Edward P. Westin
*Assistant Examiner*—R. Roseen
*Attorney, Agent, or Firm*—Foley & Lardner

[57] ABSTRACT

There is disclosed a synchronizing circuit for synchronizing a first clock signal to a second clock signal. The synchronizing circuit includes an edge-triggered set-reset latch and a delay circuit. A subclock generator generates first and second subclock signals from a synchronizing clock to control the delay circuit so that the synchronized signal at the output of the circuit is exactly one full cycle period of the synchronizing clock signal.

22 Claims, 3 Drawing Sheets

SYNCHRONIZING CIRCUIT OF TWO CLOCK SIGNALS

BACKGROUND OF THE INVENTION

The present invention relates to an improved synchronizing circuit and more particularly to a synchronizing circuit for synchronizing a first clock signal to a second clock signal over a wide range of first clock signal frequencies and pulse widths.

There are many instances in modern electronic technology wherein it is necessary to synchronize a first clock signal to a second clock signal to derive a synchronized signal which is compatible with circuitry using the second clock signal. This function is performed by synchronizing circuits which find application in discrete circuits as well as integrated circuits. Preferably, the synchronizing circuit should be capable of synchronizing a first clock to a second clock which are completely asynchronous and frequency independent.

One problem often encountered by synchronizing circuits is that the first clock signal has a frequency which is out of the range of the synchronizing circuit. In such cases, the synchronizing circuit is incapable of synchronizing the first clock signal to the second clock signal or, at best, can accomplish synchronization by only providing a synchronized signal which is not uniform. Obviously, the lack of synchronization is not acceptable in any application wherein synchronization is required and a synchronized signal which is not uniform is also generally not acceptable in most applications.

Another problem often encountered is the component count of the synchronizing circuit. This problem is most often encountered when a synchronizing circuit is implemented within an integrated circuit since integrated die area is very important. Hence, there is a continued need for a synchronizing circuit which may be implemented with fewer components to decrease the integrated circuit die area required for this function.

The present invention overcomes the aforementioned problems by providing a synchronizing circuit which is capable of deriving a synchronized clock output from a first clock signal which is synchronized to a second clock signal wherein the first clock signal may very widely in frequency and pulse width as long as its frequency is not higher than the second clock signal frequency. The synchronizing circuit accomplishes this end, while also reducing the number of required components by including a set-reset latch and a delay circuit.

SUMMARY OF THE INVENTION

The invention provides a synchronizing circuit for synchronizing a first clock signal to a second clock signal for deriving a synchronized signal wherein the clock and synchronized signals include leading and trailing edges. The synchronizing circuit includes an input adapted to be coupled to the first signal, an output for providing the synchronized signal, and set-reset means coupled to the input and responsive to the first signal for being set to a first state and being coupled to the output and responsive to the synchronized signal for being reset to a second state. The synchronizing circuit further includes delay means coupled between the set-reset means and the output for conveying the first and second states to the output responsive to the second signal for providing the synchronized signal.

The present invention further provides a synchronizing circuit for synchronizing a first clock signals to a second clock signal for providing a synchronized signal wherein the clock and synchronized signal include leading and trailing edges. The synchronizing circuit includes an input adapted to be coupled to the first signal, an output for providing the synchronized signal, and an edge triggered set-reset latch coupled to the input and being arranged for being set by the first signal leading edge to a first state and coupled to the output for being reset by the synchronized signal leading edge to a second state. The synchronizing circuit further includes subclock signal generator means including first and second outputs and adapted to be coupled to the second signal for generating first and second subclock signals at the first and second outputs respectively. The first and second subclock signals include leading and trailing edges wherein the leading edges of the first subclock signal correspond to the leading edges of the second clock signal. The synchronizing circuit further includes conveying means including serially coupled first and second stages coupled between the edge triggered set-reset latch and the circuit output. The second stage is coupled immediately adjacent the circuit output and the first stage is coupled between the latch and the second stage. The first stage is coupled to the second subclock signal and the second stage is coupled to the first subclock signal. The first and second stages are arranged to convey the states to the circuit output responsive to the first and second subclock signals.

BRIEF DESCRIPTION OF THE DRAWINGS

The features of the present invention which are believed to be novel are set forth with particularity in the appended claims. The invention, together with further objects and advantages thereof may best be understood by making reference to the following description taken in conjunction with the accompanying drawings in the several figures of which like reference numerals identify identical elements and wherein:

DESCRIPTION OF THE PREFERRED EMBODIMENT

Figure 1:
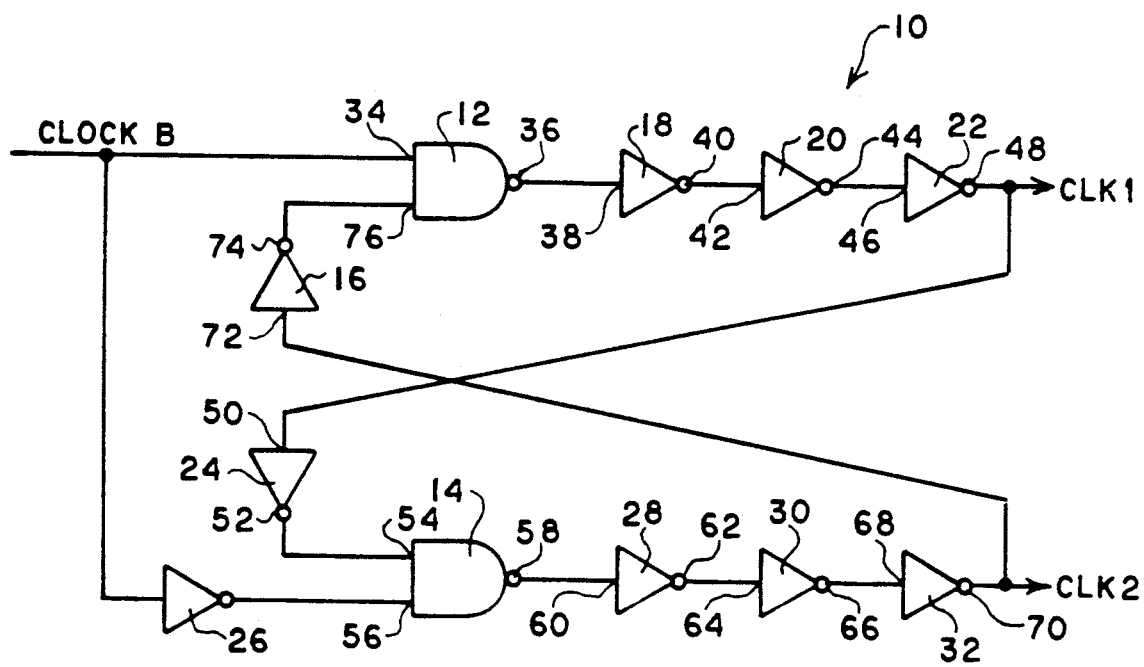
FIG. 1 is a schematic circuit diagram of a subclock signal generator embodying the present invention.

Referring now to FIG. 1, it illustrates a subclock signal generator 10 embodying the present invention. The subclock signal generator 10 is utilized to generate first and second subclock signals from the second clock signal to which the first clock signal is synchronized. The first and second subclock signals are applied to a delay means which conveys the synchronized signal to the output of the synchronizing circuit shown in FIG. 3.

The subclock signal generator 10 includes a first NAND gate 12, a second NAND gate 14, and a plurality of inverters 16, 18, 20, 22, 24, 26, 28, 30 and 32. NAND gate 12 includes a first input 34 which is adapted to be coupled to the second clock signal identified as CLOCK B. NAND gate 12 includes an output 36 which is coupled to an input 38 of inverter 18. Inverter 18 includes an output 40 which is coupled to an input of inverter 20. Inverter 20 has an output 44 coupled to the input 46 of inverter 22. The output 48 of inverter 22 comprises the output which provides the first subclock signal identified as CLK 1. The output 48 of inverter 22 is coupled to the input 50 of inverter 24 which has an output 52 coupled to an input 54 of NAND gate 14.

NAND gate 14 has another input 56 which is coupled to the second clock signal (CLOCK B) through the inverter 26. NAND gate 14 also includes an output 58 which is coupled to an input 60 of inverter 28. Inverter 28 includes an output 62 which is coupled to the input 64 of inverter 30. Inverter 30 has an output 66 coupled to the input 68 of inverter 32 and inverter 32 has an output 70 which provides the second subclock signal identified as CLK 2. The output 70 of inverter 32 is also coupled to an input 72 of inverter 16 which includes an output 74 which is coupled to the second input 76 of NAND gate 12.

Figure 2:
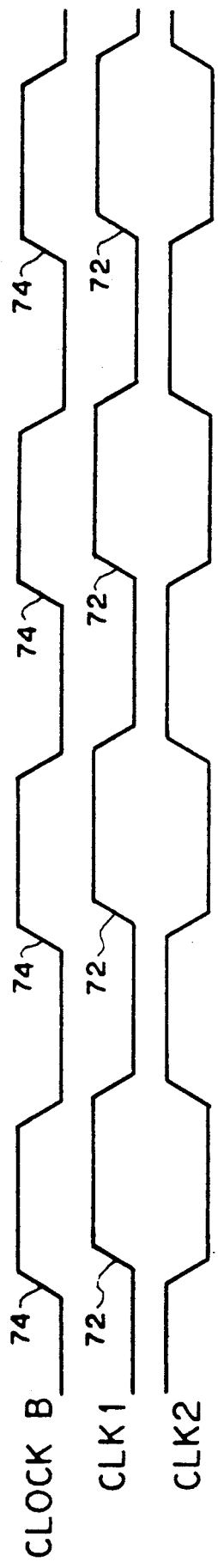
FIG. 2 are wave forms illustrating the subclock signals generated by the subclock signal generator of FIG. 1 in relation to the input clock signal to the subclock signal generator of FIG. 1.

FIG. 2 illustrates the first and second subclock signals which are derived by the subclock signal generator 10 of FIG. 1 in response to the second clock signal (CLOCK B). As will be noted, the first subclock signal (CLK 1) and second subclock signal (CLK 2) are non-overlapping signals derived from the second clock signal (CLOCK B). of particular importance is the fact that the leading edges 72 of the first subclock signal correspond to the leading edges 74 of the second clock signal. The trailing edges of the first subclock signal are formed by a transition from a high voltage level to a low voltage level and the trailing edges of the second subclock signal are formed by the transition from a low voltage level to a high voltage level.

Figure 3:
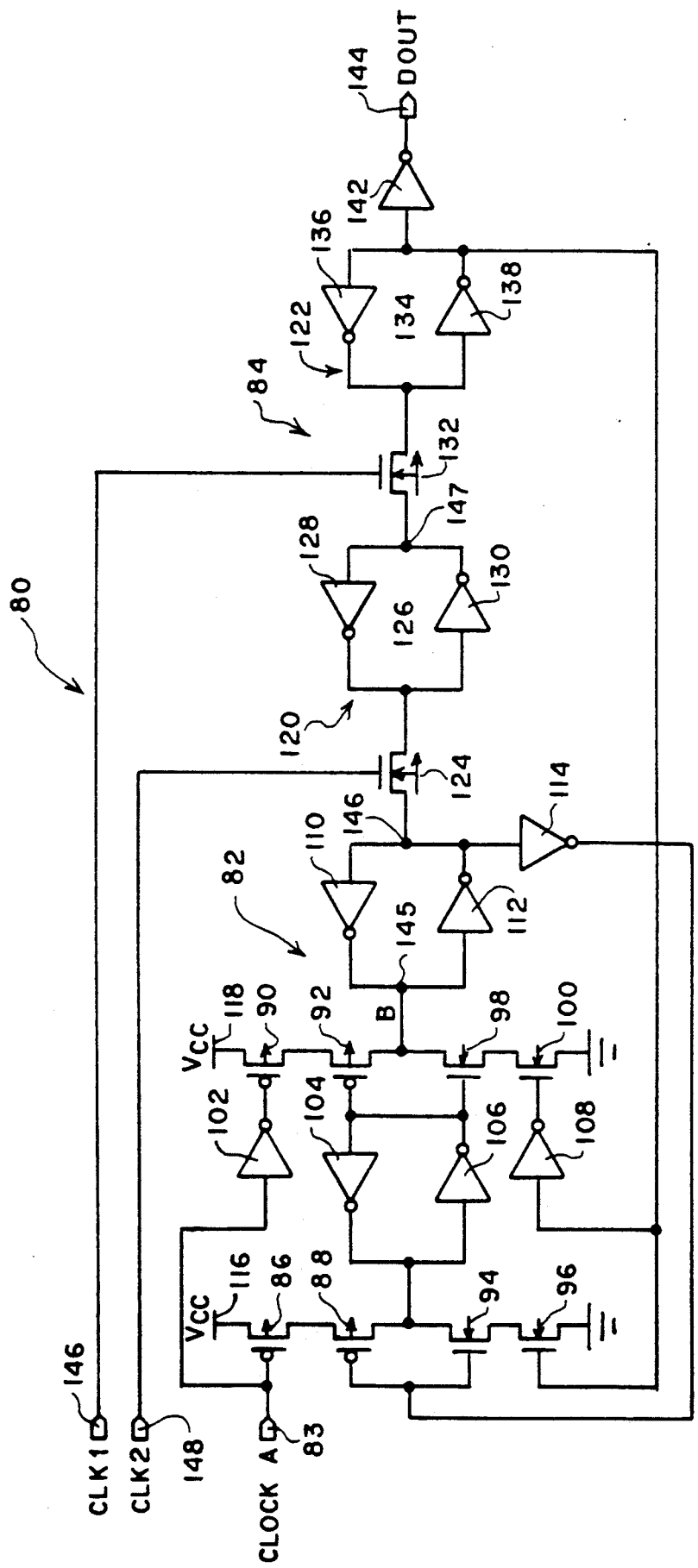
FIG. 3 is a schematic circuit diagram of a synchronizing circuit embodying the present invention.

Referring now to FIG. 3, it illustrates, in schematic circuit diagram form, a synchronizing circuit 80 embodying the present invention. The synchronizing circuit 80 generally comprises an edge-triggered set-reset latch 82 and a delay circuit 84. The edge-triggered set-reset latch 82 includes an input 83 adapted to be coupled to the first clock signal identified as CLOCK A which is the clock signal which is to be synchronized to the second clock signal so that it is compatible therewith. The set-reset latch 82 further includes a plurality of P-channel field-effect transistors 86, 88, 90, and 92, a plurality of N-channel field effect transistors 94, 96, 98, and 100, and a plurality of inverters 102, 104, 106, 108, 110, 112, and 14.

The input 83 is coupled to the gate of transistor 86 which has its source coupled to a power supply terminal 116 ($V_{cc}$). The drain of transistor 86 is coupled to the source of transistor 88 and the drain of transistor 88 is coupled to the drain of transistor 94. The source of transistor 94 is coupled to the drain of transistor 96 and the source of transistor 96 is coupled to ground potential.

The input 83 is also coupled to the gate of transistor 90 through the inverter 102. The source of transistor 90 is coupled to a power supply terminal 118 ($V_{cc}$). The drain of transistor 90 is coupled to the source of transistor 92 which has its drain coupled to the drain of transistor 98. The source of transistor 98 is coupled to the drain of transistor 100 which has its source coupled to ground potential. The gates of transistors 92 and 98 are coupled together and to a first side of a latch comprising reversed coupled inverters 104 and 106. The other side of the latch comprising inverters 104 and 106 are coupled to the drain of transistor 88 and the drain of transistor 94.

The drains of transistors 92 and 98 are also coupled to one side of another latch comprising the reversed coupled inverters 110 and 112. The other side of the latch comprising inverters 110 and 112 are coupled to the gates of transistors 88 and 94 through the inverter 114.

The delay circuit 84 comprises a first stage 120 and a second stage 122. The first stage 120 includes a switch means in the form of a N-channel field-effect transistor 124 and a first latch 126 comprising a pair of reversed coupled inverters 128 and 130. The second stage 122 similarly includes a switch means in the form of a N-channel field effect transistor 132 and a second latch 134 comprising a pair of reversed coupled inverters 136 and 138.

Transistor 124 is coupled between the latch formed by inverters 110 and 112 and the latch 126. Transistor 132 is coupled between the latch 126 of the first stage 120 and the latch 134. The output of inverter 138 is connected to the input of inverter 142 whose output 144 comprises the output (DOUT) of the synchronizing circuit 80.

As can thus be seen, the first stage 120 and second stage 122 of the delay circuit 84 are coupled in series between the set-reset latch 82 and the output 144. The second stage 122 is immediately adjacent the output 144 and the first stage coupled between the set-reset latch 82 and the second stage 122.

To complete the description of the synchronizing circuit 80, the output of inverter 138 is coupled to the gate of transistor 100 through inverter 108. The output of inverter 138 is also coupled to the gate of transistor 96. The gate of transistor 124 is coupled to an input terminal 148 Which is adapted to receive the second subclock signal (CLK 2). Similarly, the gate of transistor 132 is coupled to an input terminal 146 which is adapted to receive the first subclock signal (CLK 1).

Figure 4:
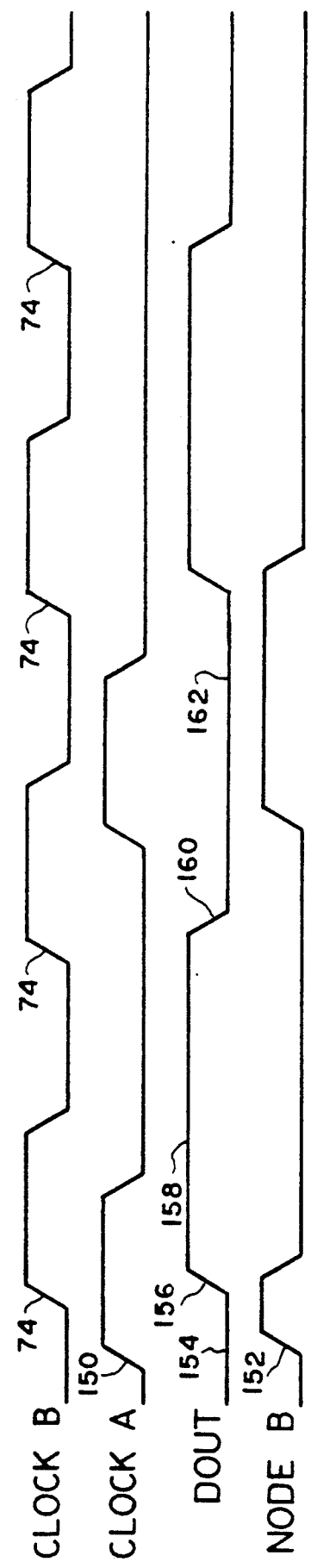
FIG. 4 illustrates a series of wave forms which may be utilized in understanding the operation of the synchronizing circuit of FIG. 3.

In operation, and by making reference to FIG. 4, When the first clock signal (ClOCK A) goes high, that is, when the leading edge 150 of the first clock signal appears at the input 83, the set-reset latch 82 will be edge-triggered to cause node 145 (Node B) to go high as indicated by the leading edge 152. When node 145 is set high, the set-reset latch 82 is set to a first state wherein node 146 is set to a low level. Because the second subclock signal is high at this time, transistor 124 will conduct to cause the low voltage level at node 146 to be conveyed through the first stage 120 and to appear as a high voltage level at node 147. When the second clock signal (CLOCK B) goes high, that is, at the next leading edge 74, the first subclock signal (CLK 1), in response to the leading edge of the second clock signal will go high as indicated by the leading edge 72 shown in FIG. 2. Upon the leading edge 72 of the first subclock signal, transistor 132 will conduct to convey the high voltage level at node 147 to the output 144 to cause the output 144 to transition from a low voltage level 154 through a leading edge 156 to a high voltage level 158 which may be seen in FIG. 4 as DOUT or the synchronized signal. When the synchronized signal goes high, the set-reset latch 82 will be reset to a second state by the leading edge 156. In the second state, the node 145 (Node B) goes low and node 146 goes high. The high voltage level at node 146 is not conveyed through the first stage 120 of the delay circuit 84 until the second subclock signal goes high. When the second subclock (CLK 2)

goes high, the high voltage 146 is conveyed through the first stage 120 and appears as a low voltage level at node 147. At the next leading edge 74 of CLOCK B, the first subclock signal (CLK 1) goes high to cause transistor 132 to conduct and to convey the low voltage level at node 147 through the second stage 122 so that the synchronized signal at the output 144 (DOUT) goes from the high voltage level 158, through the trailing edge 160, and to the low voltage 162.

When the first clock signal (CLOCK A) once again goes high, the set-reset latch 82 will once again be set to its first state and the foregoing sequence repeats. Hence, the synchronizing circuit 80 functions so that when CLOCK A goes from low to high, node B is set high. The synchronized signal (DOUT) goes high on the next rising edge of the second clock signal (CLOCK B). The rising edge of the synchronized signal is applied to the edge-triggered set-reset latch 82 to cause node B to be reset low. The synchronized signal at output 144 will go low on the next rising edge of the second clock signal (CLOCK B).

As a result, the delay circuit 84 is arranged to convey the first and second states of the set-reset latch 82 to the output 40 at alternating trailing edges of the second clock signal. As a result, the pulse width of the synchronized signal will always be one full cycle period of the second clock signal (CLOCK B) even though the first and second clock signals may be completely asynchronous and frequency independent.

As can be appreciated by those skilled in the art, the subclock signal generator of FIG. 1 and the synchronizing circuit of FIG. 3 may all be implemented in integrated circuit form utilizing MOS technology. The synchronizing circuit of the present invention, by virtue of the exact timing provided by the delay circuit, assures that the synchronized signal will be compatible with circuitry used by the synchronizing clock or the second clock signal as referred to herein. The synchronizing circuit of the present invention has been found to be less sensitive to the pulse widths of the first clock signals and, more specifically, the pulse widths of the clock signal to be synchronized can be much narrower with respect to the pulse width of the synchronizing clock signal than previously obtainable.

While a particular embodiment of their present invention has been shown and described, modifications may be made, and it is therefore intended to cover all such changes and modifications which fall within the true spirit and scope of the invention.

What is claimed is:

1. A synchronizing circuit for synchronizing a first clock signal to a second clock signal for deriving a synchronized signal, said first and second clock signal and said synchronized signal including leading and trailing edges, said synchronizing circuit comprising:
   an input for receiving said first clock signal;
   an output for providing said synchronized signal;
   set-reset means coupled to said input and responsive to said first clock signal for being set to a first state and being coupled to said output and responsive to said synchronized signal for being reset to a second state; and
   delay means coupled between said set-reset means and said output for conveying said first and second states to said output responsive to said second clock signal for providing said synchronized signal.

2. A synchronizing circuit as defined in claim 1 wherein said set-reset means is responsive to said leading edges of said first clock signal for being set to said first state.

3. A synchronizing circuit as defined in claim 2 wherein said conveyed first state forms the leading edge of said synchronized signal.

4. A synchronizing circuit as defined in claim 3 wherein said set-reset means are responsive to said leading edge of said synchronized signal for being reset to said second state.

5. A synchronizing circuit as defined in claim 4 wherein said conveyed second state forms the trailing edge of said synchronized signal.

6. A synchronizing circuit as defined in claim 5 wherein said delay means are responsive to the leading edges of said second clock signal for conveying said first and second states to said output.

7. A synchronizing circuit as defined in claim 6 wherein said delay means are arranged to convey said first and second states to said output at alternating leading edges of said second clock signal.

8. A synchronizing circuit as defined in claim 7 wherein said delay means includes first and second serially coupled stages.

9. A synchronizing circuit as defined in claim 8 further including clock generator means for deriving from said second clock signal first and second subclock signals, said second subclock signal being applied to said first stage and said first subclock signal being applied to said second stage.

10. A synchronizing circuit as defined in claim 9 wherein said subclock signals include leading and trailing edges, and wherein said clock generator means includes means for generating the leading edges of said subclock signals responsive to the leading edges of said second clock signal.

11. A synchronizing circuit as defined in claim 10 wherein said delay means convey said first and second states to said output responsive to said leading edges of said first subclock signal.

12. A synchronizing circuit as defined in claim 11 wherein said delay means convey said first and second states to said output at alternating leading edges of said first subclock signal.

13. A synchronizing circuit as defined in claim 12 wherein said set-reset means comprises an edge-triggered set-reset latch.

14. A synchronizing circuit as defined in claim 13 wherein each said delay means stages comprise switch means responsive to a respective one of said subclock signals and a pair of parallel coupled inverters, said inverters being coupled with the input of one said inverter being coupled to the output of the other said inverter.

15. A synchronizing circuit as defined in claim 14 wherein each said switch means comprises a field-effect transistor having a gate for receiving a respective one of said subclock signals.

16. A synchronizing circuit as defined in claim 12 wherein said delay means stage responsive to said first subclock signal is coupled immediately adjacent said output and wherein the other said delay means stage is coupled between said set-reset means and said delay means stage responsive to said first subclock signal.

17. A synchronizing circuit as defined in claim 5 wherein said conveyed first state is a high voltage level and wherein said conveyed second state is a low voltage level.

18. A synchronizing circuit for synchronizing a first clock signal to a second clock signal for providing a synchronized signal, said first and second clock signals and said synchronized signal including leading and trailing edges, said synchronizing circuit comprising:
  an input for receiving said first clock signal;
  an output for providing said synchronized signal;
  an edge-triggered set-reset latch coupled to said input for being set by said first clock signal leading edge to a first state and coupled to said output for being reset by said synchronized signal leading edge to a second state;
  subclock signal generator means including first and second outputs and responsive to said second signal for generating first and second subclock signals at said first and second outputs respectively, said first and second subclock signals including leading and trailing edges, the leading edges of said first subclock signal corresponding to said leading edges of said second clock signal; and
  conveying means comprising serially coupled first and second stages coupled between said edge-triggered set-reset latch and said circuit output, said second stage being coupled immediately adjacent said circuit output and said first stage being coupled between said edge-triggered set-reset latch and said second stage, said first stage being coupled to said subclock signal generator means second output and said second stage being coupled to said subclock signal generator means first output, said first and second stages being responsive to said first and second subclock signals for conveying said first and second states to said circuit output.

19. A synchronizing circuit as defined in claim 18 wherein said first and second states are conveyed through said second stage responsive to said leading edges of said first subclock signal.

20. A synchronizing circuit as defined in claim 19 wherein said first state is a high voltage level output and said second state is a low voltage level output.

21. A synchronizing circuit as defined in claim 20 wherein the conveyance of said first state forms said leading edge of said synchronizing signal.

22. A synchronizing circuit as defined in claim 21 wherein said leading edge of said first clock signal comprises a transition from a low voltage level to a high voltage level.

* * * * *